United States Patent [19]  
Bohg et al.

[11] 4,091,169  
[45] May 23, 1978

[54] SILICON OXIDE/SILICON NITRIDE MASK WITH IMPROVED INTEGRITY FOR SEMICONDUCTOR FABRICATION

[75] Inventors: Armin Bohg, Ehningen; Eckehard Ebert, Boblingen; Erich Mirbach, Sindelfingen, all of Germany

[73] Assignee: International Business Machines Corporation, Armonk, N.Y.

[21] Appl. No.: 720,542

[22] Filed: Sep. 7, 1976

[30] Foreign Application Priority Data

Dec. 18, 1975 Germany .............................. 2557079

[51] Int. Cl.² .............................................. B32B 17/06
[52] U.S. Cl. ................................. 428/428; 428/323; 428/446; 427/122; 427/94; 148/187
[58] Field of Search ............... 427/94, 249, 248 B, 427/122; 148/187; 428/323, 408, 428, 446

[56] References Cited

U.S. PATENT DOCUMENTS

| B 581,564 | 3/1976 | Jacobson | 427/94 |
| 3,503,798 | 3/1970 | Yoshioka | 427/94 |
| 3,520,722 | 7/1970 | Scott | 427/94 |
| 3,549,411 | 12/1970 | Bean | 427/94 |
| 3,574,677 | 4/1971 | Pammer | 427/94 |
| 3,637,423 | 1/1972 | Sestrich | 427/94 |
| 3,652,324 | 3/1972 | Chu | 427/94 |
| 3,652,331 | 3/1972 | Yamazaki | 427/94 |
| 3,874,919 | 4/1975 | Lehman | 428/469 |

FOREIGN PATENT DOCUMENTS 1,957,952  5/1971  Germany .............................. 427/94

*Primary Examiner*—Ellis P. Robinson  
*Attorney, Agent, or Firm*—Henry Powers

[57] ABSTRACT

A semiconductor dielectric layer formed of silicon nitride having a uniform dispersion of carbon therein for providing reduced intrinsic tensile stresses of less than $10 \times 10^9$ dyn/cm².

16 Claims, 4 Drawing Figures

SILICON OXIDE/SILICON NITRIDE MASK WITH IMPROVED INTEGRITY FOR SEMICONDUCTOR FABRICATION

FIELD OF THE INVENTION

This invention relates to semiconductor device fabrication, and more particularly, to an improved silicon oxide/silicon nitride composite mask for use in fabrication of semiconductor devices.

DESCRIPTION OF THE PRIOR ART

In the manufacture of semiconductor components, particularly in planar technology, silicon dioxide finds general application as a masking material for selective diffusion of a dopant, normally in a gaseous phase, into a semiconductor body or substrate.

Silicon dioxide masks are also employed for the formation of dielectric isolation sites in semiconductor substrates. This technique basically comprises the formation of a silicon dioxide mask (to protect selected portions of the underlying silicon substrate from oxidation), etching in the open areas of the substrate where isolation zone are to be formed, and subsequently exposing the structure to a silicon oxide forming atmosphere to generate a silicon dioxide region or fill in the etched regions.

In lieu of silicon dioxide, silicon nitride (e.g. $Si_3N_4$) has also been used for the same purpose, particularly in diffusion applications utilizing dopants to which silicon dioxide masks are permeable. Processes for forming silicon nitride coating or layers on semiconductor substrates are well known in the art. For example, in German Pat. No. 1,521,337, a process is described for the deposition of silicon nitride from an atmosphere of silane, ammonia and hydrogen at a substrate temperature of 750° to 1100° C, with simultaneous cooling of the reaction tube walls, in which a non-porous silicon nitride is deposited on a semiconductor substrate. Also, in German Pat. No. 1,640,486, a process is described for the reactive sputtering of a silicon target by a high frequency operated corona discharge, in a nitrogen atmosphere at a pressure in the range of 0.5 to 20 $\mu$m Hg. In this process, silicon nitride is formed which is deposited as a thin film on the substrate.

In both, the pyrolytic as well as the sputtering process, the silicon nitride layers formed are characterized with a high intrinsic stress. As a consequence thereof, the silicon nitride layers, when directly applied onto the surface of semiconductors, are occasioned with impairment of the operation of the semiconductor devices, and induce damage such as the formation of crystal defects in the semiconductor at their surfaces adjacent the edges of the etched openings in the silicon nitride mask. Among the solutions to these disadvantages is the use of an intermediate layer of silicon dioxide between the silicon nitride layer and the semiconductor surface. Another solution described in U.S. Pat. No. 3,874,919 is the use of composite layers, sequentially, of oxygenated silicon nitride and silicon nitride for masking of semiconductors. This composite mask minimizes, if not eliminates, the occasion of the noted crystal defects due to the closer match of thermal expansion coefficients of silicon oxynitride and silicon.

Irrespective of the noted improvements directed to the use of silicon nitride for masking of semiconductor devices, their deleterious effects cannot be completely eliminated, as for example by the utilization of a silicon dioxide or a silicon oxynitride layer between the semiconductor surface and the silicon nitride layer.

SUMMARY OF THE INVENTION

It is accordingly an object of this invention to provide an improved mask of silicon nitride characterized with a significantly reduced intrinsic tensile stress for use as a mask on the surface of a semiconductor substrate.

It is accordingly another object of this invention to provide a method of forming an improved mask of silicon nitride with a significantly reduced intrinsic tensile stress on the surface of a semiconductor substrate.

These and other objects are achieved by deposition of a silicon nitride layer or coating on a semiconductor substrate from a gaseous phase comprised of a silicon nitride forming atmosphere containing a gaseous hydrocarbon in sufficient concentration to provide a coherent carbon-containing layer of silicon nitride as a coating over an intermediate silicon dioxide layer initially formed on the silicon substrate.

It is also another object of this invention to provide an improved mask on the surface of a semiconductor substrate comprised of a composite layer of silicon dioxide and a silicon nitride coating thereover with said silicon nitride coating having carbon particles dispersed therein.

The invention also comprehends the use of the composite mask on silicon semiconductor substrates and the use of these masking layers for making silicon dioxide dielectric isolation regions or diffused regions in silicon semiconductor substrates.

These improved masks which are formed in accordance with this invention have the advantage in that the intrinsic tensile stresses, which are generated isothermally during deposition of the silicon nitride film, are reduced to about half of their original value by the presence of carbon particles in the silicon nitride film. These improved characteristics of the silicon nitride eliminate the disadvantages encountered in the use of composite silicon oxide/silicon nitride masks on the surface of the semiconductor substrates discussed above.

The foregoing and other objects, features and advantages of the invention will be apparent from the following more particular description of preferred embodiments of the invention.

DESCRIPTION OF THE PREFERRED EMBODIMENTS

It is to be understood that for purposes of simplicity and facilitating the description and understanding of the invention, the invention is discussed with respect to a semiconductor arrangement with an uncomplicated structure. As will be appreciated, a typical semiconductor arrangement will contain one or more devices which can include field effect transistors, bipolar transistors, resistors, and the like, such as shown and discussed in the aforesaid U.S. Pat. No. 3,874,919.

Figure 1:
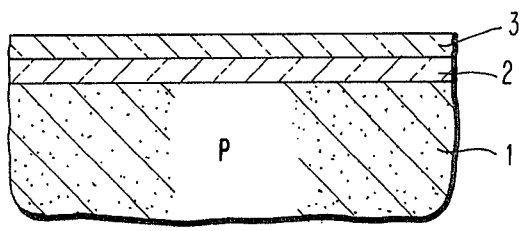
FIGS. 1 and 2 are cross-sectional schematic drawings illustrating various stages in the fabrication of masks on a semiconductor substrate.
Figure 2:
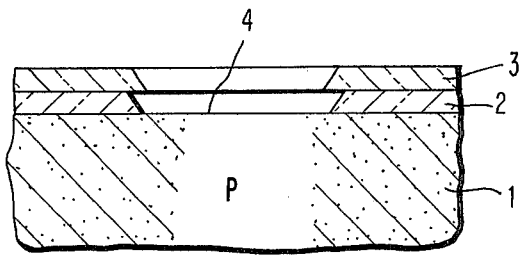

Accordingly, two stages of the process steps in the manufacture of semiconductor devices in accordance with the present invention are schematically illustrated in FIGS. 1 and 2. As shown, the surface of a monocrystalline silicon semiconductor substrate 1 is thermally oxidized to form a silicon dioxide layer 2. As will be appreciated, the silicon dioxide layer can be pyrolytically deposited from a gaseous phase onto substrate 1, particularly if of other composition, e.g. germanium. For example, as a standard reaction gas for this purpose, a mixture of silicon tetrachloride and steam (optionally diluted with an inert gas, if required) can be used. The oxidation of the surface of the silicon substrate, or the deposition of silicon dioxide from a gaseous phase is continued until the desired layer thickness is obtained, which illustratively can be in the order of 500 to 1500 Angstroms.

After the formation of the silicon dioxide layer 2, a coherent carbon-containing silicon nitride layer is formed over the silicon dioxide layer 2. The basic components of the reactive atmosphere for depositing the carbon containing silicon nitride can comprise of mixture of a compound of the group comprised of silane, halogensilane, alkylsilane, or arylsilane with ammonia or volatile amine, to which is admixed a gaseous hydrocarbon of the group of methane, ethane, propane, butane, ethylene, propylene, butylene, isobutylene, and the like, in an amount of about 1 to 5 volume percent relative to the silane flow rate. Normally, the basic silicon nitride forming atmosphere can be mixed with a carrier gas from which the desired carbon-containing silicon nitride layer is deposited on the heated semiconductor substrate. This carbon-containing nitride layer can be of a thickness of at least 100 Angstroms, and normally in the general range of between 500 to 2,000 Angstroms.

Figure 3:
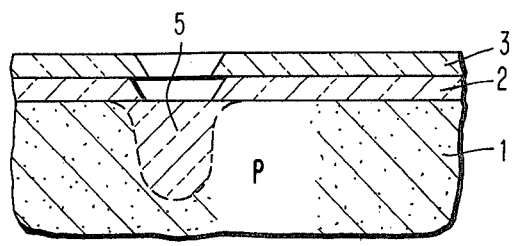
FIG. 3 is a cross-sectional schematic drawing illustrating the application of the mask of FIG. 2 to the formation of dielectric isolation regions.

After the formation of the composite masks $\frac{2}{3}$ and opening 4 is formed through both layers 2 and 3 in the areas corresponding to the portion of the substrate in which isolation zones 5 are to be formed. The opening 4 through the composite layers is effected in accordance with conventional photolithographic masking and etching techniques. Typically, a photoresist layer with corresponding openings is formed on layer 3 to enable a suitable etchant to act through the openings on the exposed substrate. The carbon-containing silicon nitride layer 4 can be etched by conventional etching employed for known silicon nitride layers heretofore employed, for example hot concentrated phosphoric acid (Kp 185°) or ammonium dihydrogen phosphate (NH$_4$H$_2$PO$_4$). After the formation of opening 4 through the silicon nitride layer 3, the structure is etched to form an opening through the silicon dioxide layer to the substrate surface. For this purpose, the substrate is immersed in an etchant affecting the exposed area 4 of the silicon dioxide layer 2, e.g. in a hydrofluoric acid buffered with ammonia fluoride. During this second etching process, the opening 4 is continued through the silicon dioxide layer so that the opening reaches down to the surface of the substrate 1 (FIG. 2). When the formation of opening 4 is fully completed, the semiconductor structure is then brought into an oxidizing atmosphere where the thermal oxidation is carried on until the isolation zone 5 (FIG. 3) is fully completed.

Figure 4:
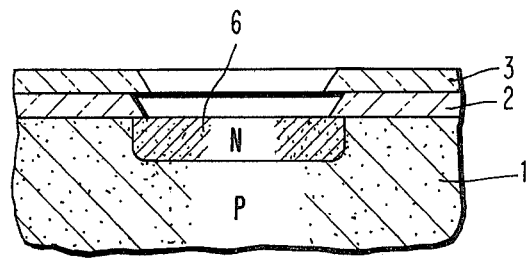
FIG. 4 is a cross-sectional schematic drawing illustrating the application of the mask of FIG. 2 to the formation of diffused regions.

It is to be understood that the invention disclosed herein is applicable to the formation of masks for diffusion operations, as for example the diffusion of a sub-collector region in a monocrystalline semiconductor substrate of silicon. The fabrication of this diffusion mask is shown in FIGS. 1 and 2 taken in conjunction with FIG. 4. The silicon dioxide and silicon nitride layers 2 and 3 are formed as described above, followed by the formation of opening 4 through which the diffusion operation takes place, also as described above. After the formation of opening 4, the diffusion operation is carried out, as for example wherein an N-conductive sub-collector region is formed in the monocrystalline semiconductor substrate 1 of silicon. In these operations, conductivity determining impurities or dopants, e.g. phosphorous, are diffused through opening 4 into the surface of substrate 1.

It is also to be understood that masks can also be made for diffusion of any desired region into a semiconductor substrate, as for example an emitter region into a base region of a transistor. For this operation, the procedure is the same as discussed above. Thus, after a mask opening has been made, an N-conductive emitter region is formed in the substrate of a P-conductive base region of a transistor by means of impurity diffusions, e.g. arsenic. In general, by use of the masking layers in accordance with this invention, the undesired effects can be avoided which have been associated with the known masks formed from a composite of silicon oxide/silicon nitride.

As previously indicated, silicon nitride which is typically deposited out of a gaseous mixture of silane, ammonia and a carrier gas at an elevated temperature, shows a high intrinsic stress. Measurement of such conventional silicon nitride deposits in accordance with the process described in IBM Technical Disclosure Bulletin, Vol. 17, No. 5, October 1974, pp. 1394–1395, for measuring stresses in thin films, the values for the tensile stress of conventionally deposited silicon nitride films was found to be approximately $15.3 \times 10^9$ dyn/cm$^2$ at 800° C. If silicon nitride for making masking layers is deposited in accordance with heretofore known processes followed by formation of mask openings through these layers, the forces appearing particularly at the edges of the mask openings, induce crystal defects in the substrate of monocrystalline silicon therebeneath. These can have particularly disadvantageous effects in subsequent high temperature processing normally employed in the manufacture of integrated circuitry. If, on the other hand, masks for making isolation or diffusion regions are formed in accordance with this invention, the intrinsic stress of the silicon nitride films is considerably reduced, and the medium density of the crystal defects is reduced by a factor of 2 to 3, approximately.

In a typical operation, a semiconductor substrate of monocrystalline silicon which is coated with a thermally produced silicon dioxide layer may be brought on a carrier into a conventional reaction chamber. By means of a suitable heating device (e.g. inductive heating of a graphite susceptor carrier) the carrier is heated to a temperature between 600° and 1100° C. Normally, suitable ports at opposite ends of the reaction chamber are employed for injection of a reaction gas mixture or for the emission of gaseous reaction products, respectively. After suitable heating of the carrier and substrate, the reaction components of the atmosphere are introduced in the reaction chamber normally at some elevated pressure so that a mixture flow can be continuously maintained over the substrate surface with exiting through one of the ports of the reaction chamber. The reaction gases may be comprised of (a) ammonia or a volatile amine and (b) a compound selected from the group of silane, halogensilane, alkylsilane and arylsilane, as well as a (c) carrier gas which can comprise hydrogen and/or an inert gas such as nitrogen, with the gas components present in sufficient proportion so that they react with each other in stoichiometric quantities to form silicon nitride ($Si_3N_4$). Hydrogen is normally present in sufficient quantity for reducing the reaction speed. The volume ratio, e.g. of silane to ammonia, can be between 3 to 4 (stoichiometric ratio), and 1 to 300 or higher. An excess of hydrogen is desirable. Hydrogen impedes the reaction and also serves as a carrier gas, so that an advantageous gas flow pattern is obtained which contributes to the formation of a uniform film. The aliphatic hydrocarbons added to the silicon nitride forming atmosphere will be selected from the alkanes and alkenes containing from 1 to 4 carbon atoms, as for example methane, ethane, propane, butane, ethylene, propylene, butylene and isobutylene. The specific quantity of the aliphatic hydrocarbon which is added to the silicon nitride forming atmosphere is not critical, but the hydrocarbon can be advantageously admixed to the reaction mixture in an amount of approximately 1 to 5 vol. percent, with reference to the silane flow rate.

In a specific example, a silicon substrate provided with a thermally grown silicon dioxide layer was heated in a reaction chamber to a temperature between 600° and 1100° C, preferably to 1000° C. To a mixture of silane and ammonia (in a ratio of 1 to 300), propane ($C_3H_8$) is added in an amount of approximately 1 vol. percent with reference to the silane flow rate. The reaction gas mixture is mixed with nitrogen and/or hydrogen and directed over the substrate. The flow rate of the carrier gas-reaction gas mixture is approximately 30 liters per minute. Upon contact with the substrate, a silicon nitride film is deposited from the reactive atmosphere. In this process, deposition speeds of approximately 100 to 400 Angstroms per minute, preferably 200 Angstroms, are obtained, and homogeneous uniform silicon nitride films with a thickness of 100 to 1600 Angstroms were successfully grown onto semiconductor substrates of monocrystalline silicon provided with a silicon dioxide layer. The resistivity of such films is in the order of $10^{10}$ ohm/cm, and the relative dielectric constant lies between 6 and 7. By use of the measurement process described in the aforesaid IBM Technical Disclosure Bulletin, Vol. 17, No. 5, October 1974, pp. 1394–1395, intrinsic stresses of $9.3 \times 10^9$ dyn/cm$^2$ at 800° C were measured. These values are only approximately 60 percent of the value of $15.3 \times 10^9$ dyn/cm$^2$ usually associated with conventionally deposited silicon nitride films.

As indicated previously, the silicon nitride films formed in accordance with this invention can be used in known manners for making masks for the formation of isolation zones of silicon dioxide, or for formation of diffusion regions in silicon semiconductor bodies.

While this invention has been particularly described with reference to the preferred embodiments thereof, it will be understood by those skilled in the art that the foregoing and other changes in form and detail may be made therein without departing from the spirit and scope of the invention.

What is claimed is:

1. A silicon semiconductor substrate having an oxidized surface coated with a unitary layer comprising an imperforate film of silicon nitride carbon dispersed therein.

2. The structure of claim 1 wherein said silicon nitride layer has an intrinsic tensile stress of less than $10 \times 10^9$ dyn/cm$^2$.

3. A semiconductor structure comprised of a silicon substrate, a layer of silicon dioxide on a surface of said substrate, and a cohesive unitary layer comprising an imperforate film of a carbon containing silicon nitride on said oxide layer.

4. The structure of claim 2 wherein said silicon nitride layer has an intrinsic tensile stress of less than $10 \times 10^9$ dyn/cm$^2$.

5. A body comprising a semiconductor, and a composite dielectric on said semiconductor, said composite dielectric comprising a layer of silicon dioxide and a unitary layer comprising an imperforate film of a carbon containing silicon nitride.

6. The structure of claim 5 wherein said silicon nitride layer has an intrinsic tensile stress of less than $10 \times 10^9$ dyn/cm$^2$.

7. In a method of fabricating semiconductor devices from a semiconductor substrate having a silicon dioxide layer formed on a surface thereof, the improvement comprising forming on said oxide layer a unitary imperforate layer of a carbon containing silicon nitride pyrolytically deposited from an atmosphere of silane, ammonia and an aliphatic hydrocarbon.

8. The method of claim 7 wherein said atmosphere includes at least one member selected from the group of hydrogen and inert gases.

9. The method of claim 8 wherein said hydrocarbon is selected from the group of alkanes and alkenes containing 1 to 4 carbon atoms.

10. The method of claim 9 wherein said atmosphere includes at least one member selected from the group of hydrogen and inert gases.

11. In a method of fabricating semiconductor devices from a semiconductor substrate having a silicon dioxide layer formed on a surface thereof, the improvement comprising forming on said oxide layer a unitary imperforate layer of a carbon containing silicon nitride pyrolytically deposited from an atmosphere comprised of an aliphatic hydrocarbon, a member selected from the group of silane, halogensilanes, alkyl silanes and arylsilanes, and a member from the group of ammonia and amines.

12. The method of claim 11 wherein said atmosphere includes at least one member selected from the group of hydrogen and inert gases.

13. The method of claim 11 wherein said hydrocarbon is selected from the group of alkanes and alkenes containing 1 to 4 carbon atoms.

14. The method of claim 13 wherein said atmosphere includes at least one member selected from the group of hydrogen and inert gases.

15. The method of claim 11 wherein said hydrocarbons comprise the group of methane, ethane, propane, butane, ethylene, propylene, butylene, and isobutylene.

16. The method of claim 15 wherein said atmosphere includes at least one member selected from the group of hydrogen and inert gases.

* * * * *